United States Patent [19]

Amazawa et al.

[11] 4,207,432
[45] Jun. 10, 1980

[54] NOISE ELIMINATING SYSTEM

[75] Inventors: Kiyoshi Amazawa; Masaharu Mori, both of Toda, Japan

[73] Assignee: Clarion Co., Ltd., Tokyo, Japan

[21] Appl. No.: 856,578

[22] Filed: Dec. 1, 1977

[30] Foreign Application Priority Data

Feb. 12, 1976 [JP] Japan .................. 51-144902

[51] Int. Cl.² .................. H04H 5/00; H04B 1/10
[52] U.S. Cl. .................. 179/1 GD; 455/305; 455/312
[58] Field of Search ............. 179/1 P, 15 AN, 15 BT, 179/1 GD, 1 GE, 1 GH, 1 GJ, 1 GM, 1 GN; 325/379, 474, 475, 476, 477, 479, 480

[56] References Cited

U.S. PATENT DOCUMENTS

| | | | |
|---|---|---|---|
| 3,387,222 | 6/1968 | Hellwarth et al. | 325/476 |
| 3,611,145 | 10/1971 | O'Connor | 325/473 |
| 3,739,285 | 6/1973 | Hepp | 179/15 BT |
| 3,868,577 | 2/1975 | Watt | 325/476 |
| 3,876,943 | 4/1975 | Watt et al. | 325/479 |
| 3,967,204 | 6/1976 | Hansen | 179/15 BT |
| 4,035,729 | 7/1977 | Perry | 325/478 |

Primary Examiner—Bernard Konick
Assistant Examiner—Randall P. Myers
Attorney, Agent, or Firm—Wallenstein, Spangenberg, Hattis & Strampel

[57] ABSTRACT

A system for eliminating a noise from a stereo signal is disclosed comprising first and second signal paths to which an input stereo signal is applied simultaneously, storage means provided in the first signal path for storing an audio signal component, a pilot tone signal component and a sub-signal component of the stereo signal, the output of the storage means being grounded through a switch that is on when no noise exists, said switch being turned off when a noise exists in the stereo signal and extracting only the noise component by cancelling each signal component by its counterpart stored in the storage means, said noise component being phase inverted to be applied to the output of the second signal path.

7 Claims, 10 Drawing Figures

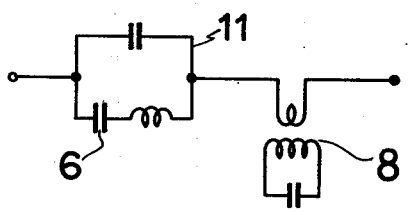
FIG. 3A
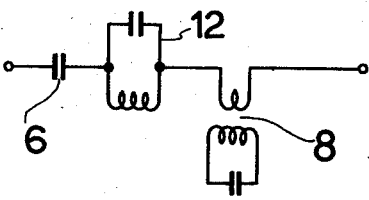
FIG. 3B
FIG. 4
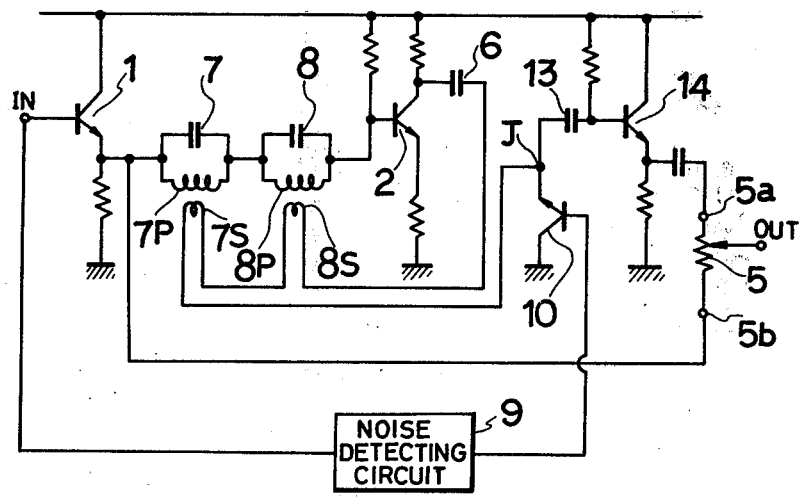

NOISE ELIMINATING SYSTEM

BACKGROUND OF THE INVENTION

This invention relates to a noise eliminating system, and more particularly, to a noise eliminating system suitable for eliminating pulsive noises from a discriminator in an FM stereo receiver.

The system for eliminating noises from an FM receiver is typically connected to a detection output, and during the period when a pulsive noise signal exists, the system switches a signal path from on-state to off-state to eliminate the noise signal. Such system functions as a low-pass filter during a period of 10 to several tens of micro seconds where a pulsive noise exists within an FM modulated frequency band, and so, the low-pass characteristics decreases the level of a 19 KHz pilot tone signal and a 38 KHz stereo sub-signal to thereby attenuate the amplitude of these two signals. To avoid such attenuation, the conventional system has provided therein a compensating circuit for retaining peaks at 19 and 38 KHz (P1 and P2 in FIG. 1) while the noise exists. FIG. 1 is a frequency characteristic curve showing the relationship between response and frequency of another conventional noise eliminating system provided with such compensating circuit; the solid line represents the characteristic curve in the case where no noise exits and the broken line represents that for the case where the noise is being eliminated.

However, for the very reason that the compensating circuit is used to provide the frequency characteristic at the time of noise elimination with peaks at 19 KHz and 38 KHz, the conventional system fails to eliminate 19 KHz and 38 KHz noise components. Hence, the effect of the conventional noise eliminating system has not been fully satisfactory.

It is therefore one of the objects of this invention to provide a system for eliminating a pulsed noise which is capable of eliminating every component of a noise signal while at the same time ensuring retention of the level of every stereo signal component.

SUMMARY OF THE INVENTION

To attain the above object this invention is characterized in that an input signal such as a stereo signal containing a noise component is simultaneously added to a first and a second signal path, and after the input signal is phase inverted in the first signal path, signal components of predetermined frequencies that have been stored in a given storage means provided in the first signal paths are cancelled from the input signal so as to extract only the noise component, which is then combined with the input signal from the second signal path to be thereby eliminated from the input signal.

BRIEF DESCRIPTION OF THE DRAWINGS

FIGS. 3A and FIG. 3B are circuits each representing another arrangement of the stereo signal blocking circuit in the embodiment of FIG. 2;

FIG. 4 is a circuit diagram showing another embodiment of the noise eliminating circuit according to this invention;

DESCRIPTION OF THE PREFERRED EMBODIMENTS

This invention is now explained by referring to the illustrated embodiments.

Figure 2:
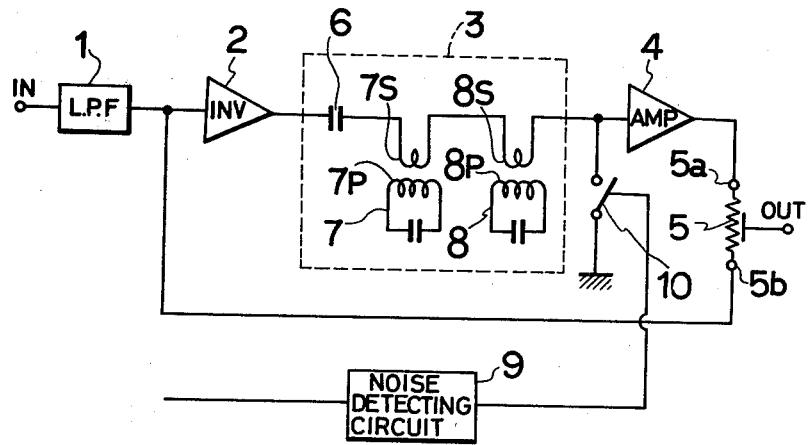
FIG. 2 is a block diagram showing one embodiment of the noise eliminating circuit according to this invention.

FIG. 2 shows a noise eliminating circuit according to this invention that is incorporated into an FM stereo signal receiver. The output of a low-pass filter (LPF) 1 connected to an input terminal is branched into the first and the second signal paths. The first signal path is connected through a phase invertor circuit 2 to the input of a stereo signal blocking circuit 3 connected through an amplifier 4 of a high input impedance to the first input terminal 5a of a combining variable resistor (adder VR) 5 of a combining circuit. A typical example of the stereo signal blocking circuit 3 comprises a storage coupling capacitor 6, a 19 KHz parallel resonance circuit 7 coupled to a transformer secondary winding 7S, and a 38 KHz parallel resonance circuit 8 coupled to a transformer secondary winding 8S, the storage coupling capacitor and the secondary windings 7S and 8S being connected in series between the input and output of the stereo signal blocking circuit 3. In the first signal path, the output of the stereo signal blocking circuit 3 is connected to the input of the amplifier 4 as well as to a normally closed circuit completing switching circuit 10 connected between ground and the input of the amplifier 4 that may include a transistor which becomes non-conductive in response to a signal pulse applied thereto from a noise detecting circuit 9. The noise detecting circuit 9 employable in the present invention may be a conventional one. It is also quite common to utilize the output of such a noise detecting circuit to operate, i.e., close or open a switching circuit for elimination of interfering noises. In this respect, further detailed description will be omitted to eliminate redundancy.

The second signal path is directly connected to the second input terminal 5b of the combining variable resistor 5.

The operation of a noise eliminating circuit constructed in the manner described above will now be explained.

An incoming stereo signal that consists of a pilot tone signal, sub-signal and L+R signal (left and right audio signals) is subjected to delaying to some extent in LPF 1 and branched into the first and the second signal paths.

In the absence of a noise component in the incoming stereo signal, no trigger pulse is generated from the noise detecting circuit 9, and so the switching circuit 10 is closed to ground and eliminates the output of the first signal path from the output of the combining variable resistor 5. Therefore, the input stereo signal that exists in the second signal path directly appears at the output of the combining variable resistor 5. However, while the switching circuit 10 is closed, the storage coupling capacitor 6 in the first signal path has a voltage thereon which follows the instantaneous charges in the audio frequency voltage (L+R signal) from the output of the phase invertor circuit 2. At the same time, a current of a signal having a frequency higher than that of the R+L signal flows through the secondary winding 7S associated with the 19 KHz parallel resonance circuit 7 and the secondary winding 8S associated with the 38 KHz parallel resonance circuit 8. This current flowing through the secondary windings 7S and 8S induces a voltage across the primary windings 7P and 8P that correspond to the voltage on the secondary windings 7S and 8S, respectively; as a result, the two resonance circuits 7 and 8 are excited to store the energy of the pilot tone signal and sub-signal contained in the input stereo signal.

If noise pulses (which generally comprises noise spikes each of relatively short duration) is contained in the incoming stereo signal, the noise detecting circuit 9 detects each incoming noise pulse component and generates a signal pulse for each of the noise pulses involved, during which signal the switch circuit 10 is opened for the short duration of the noise pulse involved. At the instant of time the switching circuit 10 opens, the storage coupling capacitor has been charged to a given voltage representing the instantaneous value of the summation of the amplitudes of the L+R signals at that instant of time, and this voltage cancels the audio frequency component of the incoming stereo signal outputted from the phase inverter circuit 2 at the instant the switching circuit 10 opens. The voltage charge on the capacitor 6 is maintained at the value stored therein before the switching circuit 10 opened because the high input impedance of the amplifier 4 prevents any significant discharge of the storage capacitor. When the switching circuit 10 is opened, the parallel resonance circuits 7 are not excited by their respective secondary windings 7S and 8S because the removal of ground from the input to the amplifier changes the impedance conditions of the circuit so as to prevent such excitation. However, as described above, the 19 KHz parallel resonance circuit 7 and the 38 KHz parallel resonance circuit 8 have the energy that has been stored in the period where no noise pulse existed, and they release such energy from their respective primary windings 7P and 8P to their secondary windings 7S and 8S. Since the voltage induced in each of the secondary windings 7S and 8S has an opposite polarity to that of the pilot tone signal and sub-signal contained in the stereo signal to be outputted from the phase invertor circuit 2, said induced voltage is cancelled by the pilot tone signal and sub-signal in the incoming stereo signal during a period where a noise pulse exists (for example, 10 to several tens of micro seconds) so as to block the pilot tone signal and the sub-signal continuously. As will be clear from the explanation given above, in the first signal path, only the noise component contained in the incoming stereo signal is supplied to the first input terminal 5a of the combining variable resistor 5. In this connection, the 19 KHz and 38 KHz components of the noise signal are faithfully transmitted to the combining variable resistor 5 because the amplifier 4 has an extremely high input impedance with respect to the noise pulse involved and the stereo signal blocking circuit 3 does not substantially work as a trap.

As detailed in the foregoing pages, during the period when a noise pulse exists, the noise pulse is phase inverted in the first signal path by the phase invertor circuit 2 and reproduced at the first input terminal 5a of the combining variable resistor 5, while at the same time, in the second signal path, the stereo signal containing the noise component is directly applied to the second input terminal 5b of the combining variable resistor 5. In consequence of this, the noise component is eliminated through the combining variable resistor 5, which outputs an undistorted stereo signal.

Figure 1:
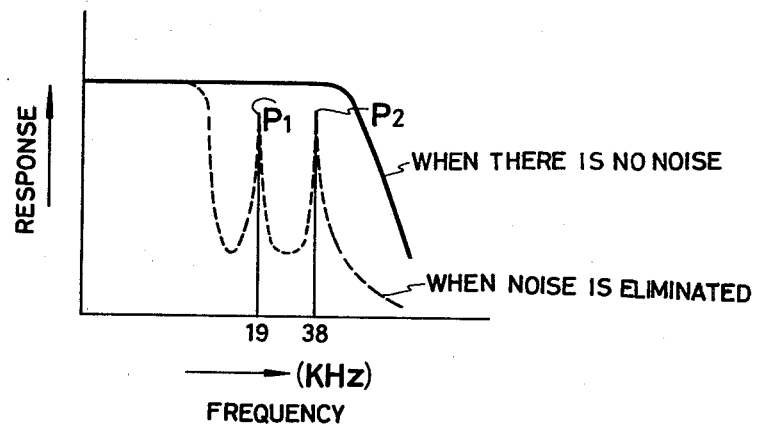
FIG. 1 is a frequency characteristic curve representing the operation of the conventional noise eliminating system provided with a compensation circuit.

FIG. 3 shows another example of the arrangement of the stereo signal blocking circuit 3 in the noise eliminating circuit of FIG. 1. Various arrangements are possible for providing this circuit with storage characteristics and parallel resonance characteristics, and FIGS. 3A and 3B are typical examples wherein the modification is directed to the 19 KHz parallel resonance circuit. According to the stereo signal blocking circuit shown in FIG. 3A, a parallel resonance circuit 11 having no secondary winding functions to block the L+R signal and the pilot tone, whereas according to the stereo signal blocking circuit shown in FIG. 3B, a parallel resonance circuit 12 having no secondary winding functions to block the pilot tone.

FIG. 4 shows another arrangement of the noise eliminating circuit according to this invention.

The output of a low-pass filter (LPF) 1 connected to the input terminal is branched into the first and the second signal paths. The first signal path is connected to the input of a phase invertor circuit 2 of a high impedance through series connected 19 KHz and 38 KHz parallel resonance circuits 7 and 8. The output of the phase invertor circuit 2 is connected to the input of a storage coupling capacitor 6. The output of the storage coupling capacitor 6 is connected to a junction point J through the respective secondary windings 8S and 7S of the series connected 38 KHz and 19 KHz parallel resonance circuits 8 and 7. The junction point J is connected through a coupling capacitor 13 and an amplifier 14 of a high input impedance to a combining circuit, for example, the first input terminal 5a of a combining variable resistor 5. The junction point J is also connected to switching circuit 10 that is actuated by a trigger signal from a noise detecting circuit 9. In contrast, the second signal path is directly connected to the second input terminal 5b of the combining variable resistor 5.

The noise eliminating circuit of FIG. 4 operates in a manner like that described in connection with FIG. 2.

Accordingly, an incoming stereo signal that consists of a pilot tone signal, sub-signal and L+R signal is subjected to delaying to some extent in LPF 1 and branched into the first and second signal paths.

In the absence of a noise component in the incoming signal, the switching circuit 10 is conductive to ground in the first signal path. Therefore, the incoming stereo signal that exists in the second signal path directly appears at the output of the combining variable resistor 5. However, while the switching circuit 10 is conductive, the voltage or storage coupling capacitor 6 follows the audio frequency voltage (L+R signal). At the same time, a large current flows through the secondary windings 7S and 8S of the 19 KHz parallel resonance circuit 7 and the 38 KHz parallel resonance circuit 8 to excite their respective resonance circuits, which in turn induces a voltage across their primary windings 7P and 8P to store energy. The induced electromotive force has inverse polarity to that of the voltage that is to be inputed into the series connected 19 KHz and 38 KHz parallel resonance circuits 7 and 8. In other words, a negative feedback operation is accomplished.

If a noise pulse is contained in the incoming stereo signal, the noise detecting circuit 9 detects incoming noise and generates a signal pulse during the period when each noise pulse exists to thereby open the switching circuits during such periods. Under such state, the storage coupling capacitor 6 works as a coupling capacitor for the amplifier 14 which has an extremely high input impedance so that the opening of the switching circuit 10 for the short duration of the noise pulse the voltage on capacitor 6 cancels the sum of the audio frequency components in the incoming stereo signal. Also, since the switching circuit 10 is open, the 19 KHz parallel resonance circuit 7 and the 38 KHz parallel resonance circuit 8 are not excited by their respective secondary windings 7S and 8S. However, as described above, the 19 KHz parallel resonance circuit 7 and the 38 KHz parallel resonance circuit 8 have the stored energy, and during the period when a noise pulse exists, the 19 KHz parallel resonance circuit 7 performs a continuous negative feedback with respect to the 19 KHz pilot tone, and the 38 KHz parallel resonance circuit 8 with respect to the stereo sub-signal at around 38 KHz. As a result, the energy stored in the 19 KHz and 38 KHz parallel resonance circuits is cancelled by the pilot tone and the sub-signal in the incoming stereo signal. As is clear from the explanation given above, in the first signal path, during a noise pulse only the noise pulse is supplied to the first input terminal 5a of the combining variable resistor 5.

FIGS. 5 and 6 are equivalent circuits respectively for the circuit of FIG. 4 considering the L+R and 19 and 38 KHz signals respectively.

Figure 5A:
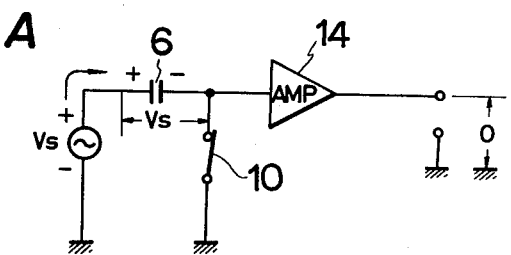
FIGS. 5A, 5B and FIGS. 6A, 6B are equivalent circuits for explaining the operation of the circuit of FIG. 4.
Figure 5B:
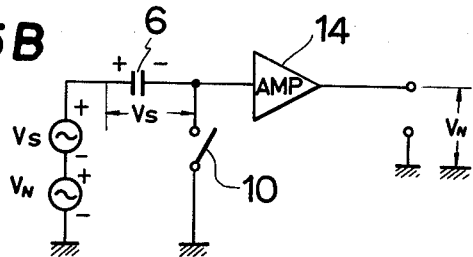

Note that the windings 7S and 8S act as short circuits to the relatively low L+R signals as shown in FIG. 5 and the storage capacitor 6 acts like a short circuit to the relatively high 19 and 38 KHz signals as shown in FIG. 6. FIG. 5A shows the case where no noise pulse exists, that is, where the switching circuit 10 is off and no output appears at the output terminal 5a. FIG. 5B shows the case where the switching circuit 10 is open and a noise component pulse appears at the output terminal 5a. In this figure, the arrow represents the direction of the charging current, Vs the signal voltage, and $V_N$ the noise voltage.

Figure 6A:
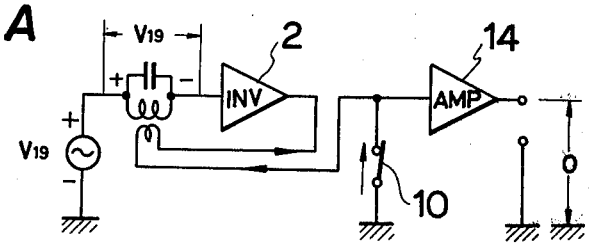
Figure 6B:
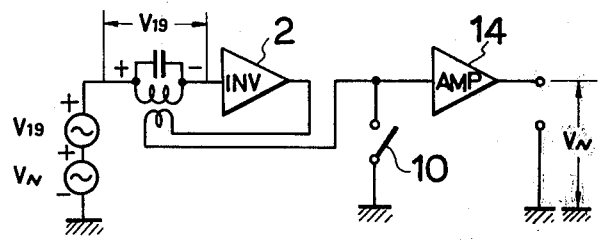

FIG. 6A shows the case where the switching circuit 10 is closed and no output appears at the output terminal of the first signal path. FIG. 6B shows the case where the switching circuit 10 is open and a noise pulse appears at the output terminal of the first signal path. In this figure, the arrow indicates the direction of the exciting current, V19 the signal voltage, and $V_N$ the noise voltage.

Figure 7:
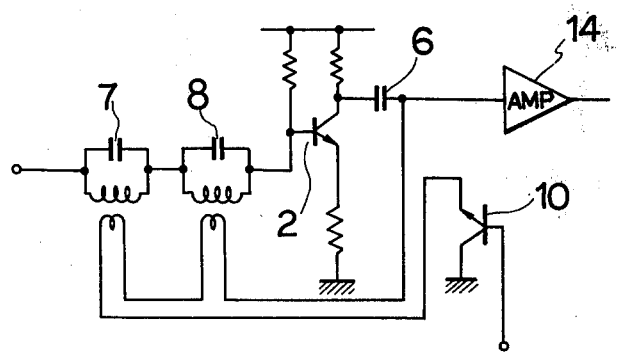
FIG. 7 is a circuit diagram showing the essential parts of another embodiment of the noise eliminating circuit according to this invention.

FIG. 7 shows still another arrangement of the noise eliminating circuit according to this invention; this example differs from the noise eliminating circuit of FIG. 4 in that the output of the storage coupling capacitor 6 is connected to the switching circuit 10 through the secondary windings 8S and 7S and that it is also connected directly to the input of the amplifier 14. But the two circuits are equivalent in operation.

As explained in the foregoing pages, according to this invention, the noise component extracted in the first signal path is as nearly like the original contained in the incoming stereo signal as possible, and therefore, a significant improvement in the effect of noise elimination can be achieved over the conventional noise eliminating system. Further, no circuit element is connected to the second signal path through which the stereo signal is to pass, and so, no adverse effect is had on the phase and amplitude of the stereo signal to cause degradation in channel separation. In addition, by using 19 KHz and 38 KHz parallel resonance circuits having respective secondary windings for exciting the resonance circuits, the mutual interference between the resonance circuits can be reduced.

What is claimed is:

1. A noise eliminating system comprising first and second signal paths having separate output terminals and a common input terminal to which is applied an input signal including desired signal components and sometimes unwanted short duration noise pulse components; desired signal component blocking means provided in said first signal path and receiving said input signal; switching means connected to said first signal path having a first switching condition in the absence of noise pulse components in said input signal and a second switching condition in the presence of noise pulse components in said input signal wherein said switching means cooperates with said desired signal component blocking means in said first switching condition to prevent said input signal from appearing at the output terminal of said first signal path; noise detecting means responsive to the noise pulse components in said input signal for operating said switching means into said second switching condition during each noise pulse component which removes said first switching condition, said blocking means then blocking only the desired signal components of the input signal in said first signal path during each noise pulse component so that only the noise pulse components in said input signal present in said first signal path appear at the output terminal thereof, said input signal passing through said second path to said output terminal thereof without cancellation of any components thereof; and means for combining the signals at the output terminals of said first and second signal paths so that the noise pulse components at the output terminals of said first and second signal paths are cancelled out, leaving the desired signal components in said second signal path at a common output terminal thereof.

2. The noise eliminating system of claim 1 wherein said input signal is a stereo signal including 19 KHz and 38 KHz control signals, and said desired signal components of said input signal are audio stereo signals, and said desired signal component blocking means includes means for storing said 19 KHz and 38 KHz signals when said switching means is in said first switching condition and for applying said stored 19 KHz and 38 KHz singals in signal cancelling opposition to the 19 KHz and 38 KHz components in said input signal when said switching means is in said second switching condition, whereby only said noise pulse components appear at the output terminal of said first signal path during the occurrence of said noise pulse components.

3. The noise eliminating system of claim 2 wherein said desired signal component blocking means includes a capacitor for blocking said audio stereo signals.

4. A noise eliminating system comprising first and second signal paths to which an input signal including stereo and control signal components is applied simultaneously; said first signal path including a capacitor and resonance means; noise detecting means for detecting a noise signal contained in said input signal; switching means normally preventing passage of said input signal through said first path and responsive to the detection of a noise signal in said input signal for passing the noise signal through said first signal path, the capacitor and the resonance means being connected for blocking the stereo and control signal components when the switching means is operated by detection of a noise signal, said input signal passing through said second signal path without cancellation of any components thereof; and means for combining the output of the first signal path and that of the second signal path so that the noise signals thereat cancel each other out.

5. A noise eliminating system according to claim 4 wherein said resonance means comprises a first parallel resonance circuit having a resonance frequency of 19 KHz and a second parallel resonance circuit connected thereto having a resonance frequency of 38 KHz.

6. A noise eliminating system according to claim 5 wherein said first and second parallel resonance circuits include coils each being connected in series between the capacitor and the switch means.

7. A noise eliminating system according to claim 5 wherein the stereo signal consists of an audio signal component and said control signal components include a pilot tone component having a frequency of 19 KHz and a sub-signal component having a frequency of 38 KHz, and the capacitor and the first and second parallel resonance circuits are respectively connected to cancel the audio signal component and the pilot tone and sub-signal components respectively from said stereo and control signal components containing noise.

* * * * *